(12) United States Patent
Doris et al.

(10) Patent No.: US 8,086,197 B2
(45) Date of Patent: Dec. 27, 2011

(54) MULTI-CHANNEL RECEIVER ARCHITECTURE AND RECEPTION METHOD

(75) Inventors: Konstantinos Doris, Amsterdam (NL); Erwin Janssen, Veldhoven (NL)

(73) Assignee: NXP B.V., Eindhoven (NL)

( * ) Notice: Subject to any disclaimer, the term of this patent is extended or adjusted under 35 U.S.C. 154(b) by 524 days.

(21) Appl. No.: 12/269,302

(22) Filed: Nov. 12, 2008

(65) Prior Publication Data

US 2010/0120386 A1 May 13, 2010

(51) Int. Cl.
*H04B 1/18* (2006.01)
(52) U.S. Cl. ............................ 455/179.1; 455/183.1
(58) Field of Classification Search .......... None
See application file for complete search history.

(56) References Cited

U.S. PATENT DOCUMENTS

| | | | |
|---|---|---|---|
| 7,012,559 B1 | 3/2006 | Pan | |
| 7,015,842 B1 | 3/2006 | Gupta | |
| 7,068,731 B1 * | 6/2006 | Merriam, Jr. | 375/316 |
| 7,197,524 B2 | 3/2007 | Sasson | |
| 7,623,580 B2 * | 11/2009 | McNaught-Davis Hess et al. | 375/260 |
| 7,944,383 B2 * | 5/2011 | Doris | 341/139 |
| 2002/0048325 A1 | 4/2002 | Takahiko | |
| 2002/0118784 A1 | 8/2002 | Teo et al. | |
| 2004/0218692 A1 * | 11/2004 | McNeely | 375/316 |
| 2005/0083223 A1 | 4/2005 | Devendorf | |
| 2005/0083231 A1 | 4/2005 | Drentea | |
| 2006/0182209 A1 * | 8/2006 | Coyne et al. | 375/349 |
| 2007/0058736 A1 * | 3/2007 | Nguyen et al. | 375/260 |
| 2010/0174768 A1 | 7/2010 | Janssen | |

FOREIGN PATENT DOCUMENTS

| | | |
|---|---|---|
| EP | 1104101 A2 | 5/2001 |
| EP | 1301030 A2 | 4/2003 |
| WO | 03/081906 A1 | 10/2003 |
| WO | 2004/082189 A2 | 9/2004 |
| WO | 2009/090514 A1 | 7/2009 |

* cited by examiner

*Primary Examiner* — Cassandra Cox

(57) ABSTRACT

A multi-channel receiver comprising an ADC and a multi-band, multi-channel selector. The ADC converts a broad-band multi-channel signal into a digital signal. The digital signal is then broken into sub-bands each containing a plurality of channels. A channel selector selects desired channels from the appropriate sub-band. The multi-channel receiver may deliver simultaneous channels equal to the number of channel selectors that have been implemented. The multi-channel receiver may be implemented on a single integrated circuit.

22 Claims, 7 Drawing Sheets

MULTI-CHANNEL RECEIVER ARCHITECTURE AND RECEPTION METHOD

BACKGROUND AND SUMMARY

Current television receivers receive a single channel through a single tuner. The evolving market for data and programming services will demand that receivers have the capability of multi-channel tuning.

A block diagram of a conventional single-channel cable TV receiver is illustrated in FIG. 1. The composite TV signal is received at the input of the receiver and amplified to the correct level with a low-noise-amplifier and variable gain amplifier (LNA/VGA) 102. A programmable band selection filter 104 can potentially make a pre-selection on the composite signal to limit its bandwidth and easy the subsequent signal processing operations.

A specific TV channel is selected with the use of a frequency synthesizer 106 that tunes to the corresponding channel frequency. By multiplying the synthesized frequency reference signal and the received signal together with the aid of the mixer circuit 108, the wanted channel is down-converted (its carrier frequency is shifted) to a convenient frequency and then all other channels left and right of it in the frequency domain are removed with use of filters 110 and 112. The remaining signal of the wanted channel is then amplified 114 further to exploit optimally the ADC 116 input range, which digitizes it. As a result of the predominantly analog signal pre-processing the signal that the ADC 116 usually samples has very low frequency of operation leading to very relaxed ADC requirements. Channel decoder 118 produces a single transport stream containing the desired signal.

The block consisting of all circuits in FIG. 1 from LNA/VGA to the input of the ADC 116 is usually called a "tuner." The tuner realizes the complete channel selection process in the analog domain and it delivers at its output a single channel at a very convenient frequency for further baseband processing. The tuner circuit has reached a very high level of design sophistication to deal with several circuit realization imperfections, such as mismatch between I/Q paths, mixer down-conversion inaccuracies, etc. In most cases, the tuner is realized in a Silicon Bipolar or BiCMOS process in order to reach the RF performance required, but which restricts the tuner from being integrated into a larger SoC system. The output of the tuner remains an analog signal since the ADC is usually realized in CMOS and placed in the decoder side.

The remaining circuitry (the ADC, the baseband processor for further digital signal processing, carrier recovery, channel decoding, source decoding, etc.) is usually a separate IC and it is called the baseband IC.

Existing receiver architectures based on the concept shown in FIG. 1 are not able to satisfy properly the need for multi-channel reception. The conventional approach would be to use many single channel tuners in parallel connected to the same input signal source to make a multi-channel tuner. This approach, however, faces major limitations related to complexity of system implementation, signal quality, and cost effectiveness. As the number of simultaneously required streams/channels goes beyond two, the conventional approach becomes completely impractical.

Implementing a truly multi-channel receiver with conventional approaches requires the input signal to be supplied to all individual single channel receivers. To achieve this, RF signal replicating means such as power splitters, RF signal buffers, etc. are used. This allows routing the RF input to the main receiver, and the replica RF signal to a second receiver. However, every time the RF input signal is replicated its quality degrades significantly with no possibility to recover the quality back.

Another draw back of building a multi-channel receiver from conventional components is that the channel selection process requires independent frequency synthesis means per tuner used. For 16 channels, 16 independent frequency synthesizers and PLL's are needed each being able to realize any channel frequency among approximately 100 in the TV band. Such an approach is clearly impractical.

Conventional I/Q receiver architectures are significantly affected by the well-known image rejection problem rising from mismatches in I and Q paths and their associated mixers. Further implementation limitations in I/Q mixers are also characteristics of this approach. For example, phase noise in the frequency translation stage (the mixer) is one of the dominant noise contaminating mechanisms of the conventional receiver architecture.

An alternative approach is to use a block receiver. This uses effectively the same architecture shown in FIG. 1. However, instead of filtering out everything but the single wanted channel, a block of channels (e.g. 5-10 TV channels) is down-converted to a convenient low frequency. After this frequency translation, all other TV signal components are removed with the aid of filters, and the resulting signal is amplified and then delivered at the output of the tuner. The block of TV channels is subsequently digitized with an ADC, faster than that required by the single channel tuner since now it needs to digitize a block of TV channels together. It becomes possible in this way to provide a few channels simultaneously at the output of the tuner.

In August of 2006, Cable Labs, Inc. issued "Data Over Cable Service Interface Specification (DOCSIS) 3.0." DOCSIS 3.0 data reception and channel binding, both of which require the simultaneous reception of at least 4 channels placed not further than 60 MHz apart from each other. The block tuner described above enables DOCSIS 3.0, but does not enable unrestricted multi-channel functionality. For example, the simultaneously received number of channels is small and there is no freedom from a user's perspective to select (or combine together for faster data reception) many/any channels freely out of the full cable TV band. The latter usually consist of up to 100 channels between 50-1000 MHz. The resulting situation is that separate receivers are required to receive both TV and DOCSIS (data) channels without the reception of one restricting the basic functionality of the other. Several implementation limitations appear as well. For example, for a 4-channel system the tuner IC needs to output four clean analog baseband output signals to the decoder IC. The block receiver approach is clearly not the best for interference reasons.

Direct sampling of cable band signals for television reception under the DOCSIS standards requires sampling and quantization of signals with GHz bandwidth with proportionally larger sampling rates and with very high dynamic range (e.g. 50-70 dB). A second major issue is the capability to process digital signals with very high data rates.

For example, assume that the input signal is a cable TV signal consisting of multiple channels of 6 MHz each bundled together between 50-1000 MHz. The result of digitization of this signal is a data rate of 20-80 Gbits/sec (10-12 b resolution at 2 GS/sec rate at minimum is needed from the ADC). The steepness of the digital filters required in order to isolate one 6 MHz channel out of 100 TV channels in the 1 GHz band at the aforementioned rate complicates the situation significantly. Conventional digital signal processing selectivity techniques are not able to deal with these issues with area and power efficiency at reasonable levels for commercial use. The resulting on-chip interference generated by the activity of such a filter is also a great concern for the proper operation of the ADC and RF amplifier.

The development of discrete high-speed ADC chips and discrete multi-channel selection filtering chips does not solve the overarching problem of managing timing issues resulting from the high sample rates required for a multi-channel receiver. The amount of digital data that needs to be transported from the ADC block to the digital filter in a true multi-channel receiver is on the order of 20-80 Gb/s, or more. Data transportation at these speeds is extremely difficult, especially when it comes to transport from one IC to another. In addition, transporting data at such rates from one IC to another requires awareness of electromagnetic compatibility (EMC) and related interference issues that can easily impair the ADC performance. The input signal of the ADC is practically the input of the receiver, therefore very weak and easily susceptible to signal degradation. Use of low swing differential signaling standards (e.g. LVDS) could reduce EMC relate issues, but not to an acceptable level due to the extreme high data rate (thus, very high number of high speed signals) to convey the real data stream of 20-80 Gbits/sec from IC to IC. Additionally, while it might seem feasible to use on-chip memory to alleviate the EMC related issues of high-speed IC-to-IC transmission, memory usage raises technical issues of its own and is not feasible in applications where real time streaming is desired.

Clocking of the operations between ADC and digital filter is also a point of concern. A discrete filter chip connected to a full rate ADC (12 b 2 GS/sec) must capture these data synchronously at 2 GHz. One approach is to use a central 2 GHz sync clock distributed between the two IC's. Alternatively, additional PLL's can be use both supplied by the same crystal oscillator. In both cases, the complexity is significantly higher because the circuits that must be synchronized may be 1-10 cm's apart.

What is needed, therefore, is a single IC receiver able to provide unrestricted multi-channel functionality.

In an embodiment, a multi-channel receiver comprises an analog-to-digital converter (ADC) configured to convert using a sampling rate S an analog signal z which resides in a frequency band B Hz to a digital signal x, wherein digital signal x is representative of analog signal z, and a multi-band selector circuit configured to receive the digital signal x and to map the digital signal x into M time domain sub-signals x1 . . . xM, wherein each sub-signal represents in a time domain a frequency domain content of digital signal x, wherein each sub-signal resides in a sub-range of band B, wherein each frequency component of digital signal x is represented at least in one of the sub-signals x1 . . . xM in its original form, and wherein each of the sub-signals x1 . . . xM has a sampling rate less than S.

In another embodiment, the multi-band selector is further configured to map the digital signal x into M time domain sub-signals x1 . . . xM hierarchically.

In yet another embodiment, the multi-channel receiver comprises at least one channel selector connected to the output of the multi-band selector. The channel selector is configured to select at least one channel out of any sub-signals x1 . . . xM.

In still another embodiment, the multi-band selector circuit comprises at least two signal branches. In this embodiment, at least one branch is a filter-bank and at least one branch is a digital frequency translator connected to another filter-bank. The sub-ranges may overlap. By way of illustration and not as a limitation, the sub-ranges overlap at least by an amount equal to a channel width of the at least one channel selector.

In an embodiment, the multi-band selector circuit comprises a plurality of processing branches corresponding to respective phases and an adder for adding branch signals from the processing branches. At least two of the plurality of processing branches comprise a sub-sampler for sub-sampling sample values of the input signal at the phase corresponding to the branch, a block realizing sign inversion of the sub-sampled values cyclically, a filter comprising a first FIR filter. The filter is applied alternately to sets of sub-samples from the sub-sampler at even sub-sample positions and to sets at odd sub-sample positions. The branches further comprise a second FIR filter applied to further sets of sub-samples at odd and even sub-sample positions from the sub-sampler when the first FIR filter is applied to the sets of sub-samples at even and odd sub-sample positions respectively. The multi-band selector further comprises a combiner for combining output samples from the first and second FIR filter into the branch signals of the branch according to a combination pattern that changes cyclically as a function of sub-sample position and is responsive to a phase of the branch.

In another embodiment, the ADC is selected from the group consisting of a time-interleaved ADC and a partitioned time-interleaved ADC.

In still another embodiment, the ADC is a partition time-interleaved ADC comprising a main signal input for inputting an analog signal into the circuit, a front end circuitry comprising a plurality (N) of sampling units each having a signal input and a signal output, wherein the signal input of each of the sampling units is connected to said main signal input, a backend circuitry comprising a plurality of demultiplexers each having a signal input and a group (K) of signal outputs, and a plurality (N) of groups (K) of ADC units each ADC unit having a signal input and a data output. In this embodiment, the signal output of each sampling unit is connected to the signal input of one demultiplexer of said plurality of demultiplexers, and the signal outputs of each demultiplexer are connected to the signal inputs of the ADC units of one group of ADC units. Additionally, the main signal input is configured to feed the analog signal to said plurality (N) of sampling units using time interleaving, and the demultiplexers are configured to feed the sampled signal to said plurality (N) of groups of ADC units using time interleaving.

In an embodiment at least one demultiplexer of the ADC comprises an additional signal processing circuit. By way of illustration and not as a limitation, the additional signal processing circuit may be a buffer, a follower, and an amplifier.

In another embodiment, at least one ADC unit of the plurality of ADC units is configured to resample the sampled signal output by the respective sampling unit.

In yet another embodiment, the ADC comprises a clock input configured to provide a first plurality of clock signals clocking the plurality of sampling units and a second plurality of clock signals clocking the plurality of groups of ADC units. In an alternate embodiment, the ADC comprises a clock input configured to provide a first plurality of clock signals clocking the plurality of sampling units and a second plurality of clock signals clocking the plurality of groups of ADC units.

In an embodiment, at least one signal conditioning unit of the ADC is arranged between the main signal input and the signal inputs of the sampling units. By way of illustration and not as a limitation, the at least one signal conditioning unit may be a copier and/or a buffer.

In still another embodiment, the ADC further comprises a data recombination unit configured to recombine the data being output by the data outputs of the ADC units of the plurality of groups of ADC units so as to generate a one-dimensional digital data stream.

In an embodiment, the combiner of a first one of the at least two of the plurality of branches is configured to form complex branch signals, a real part of the complex branch signal being formed from an output signal of the first and second FIR filter of the first one of the branches alternatingly, and an imaginary part of the complex branch signal being formed from the output signal of the second and first FIR filter of the first one of the branches when the real part is formed from the output signal of the first and second FIR filter respectively. The combiner of a second one of the at least two of the plurality of branches is configured to form the real and imaginary parts of the complex branch signal by summing and subtracting the output signal of the first and second FIR filter of the second one of the branches.

In still another embodiment, the multi-channel receiver further comprising one more channel decoders, wherein a channel decoder receives a channel signal from the channel selector. In yet another embodiment, the multi-channel receiver further comprising one or more source decoders, wherein a source decoder receives an output from a channel decoder.

In an embodiment, the multi-channel receiver further comprises a signal processing unit, wherein the signal processing unit comprises an RF pre-processing unit, wherein the RF pre-processing unit receives a source signal and provides a processed signal to the ADC. By way of illustration and not as a limitation, the RF pre-processing unit comprises at least one of a filter, a low-noise amplifier, a variable gain amplifier and an equalizer.

DETAILED DESCRIPTION

Figure 1:
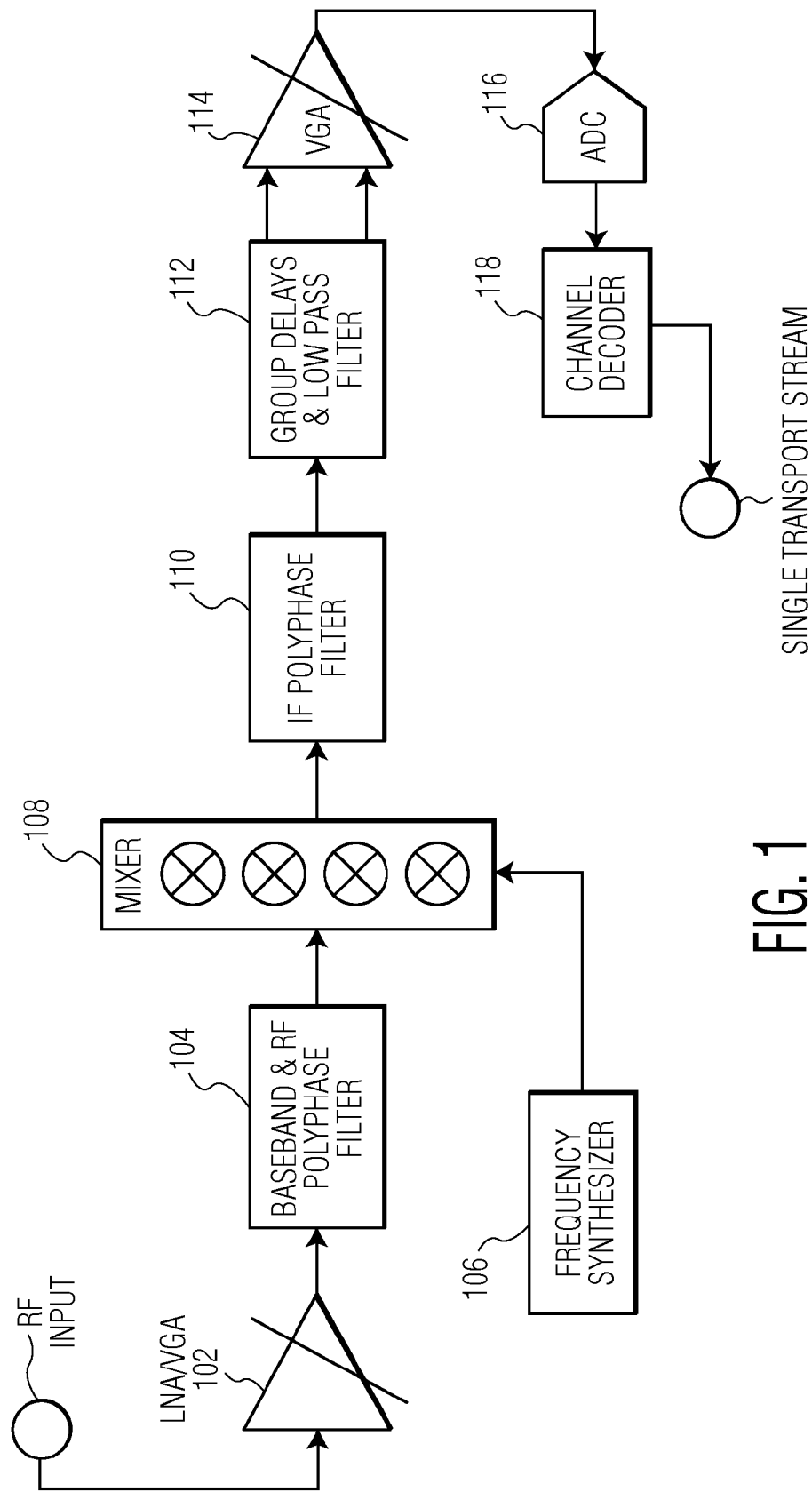
FIG. 1 illustrates a receiver architecture according to the prior art.
Figure 2:
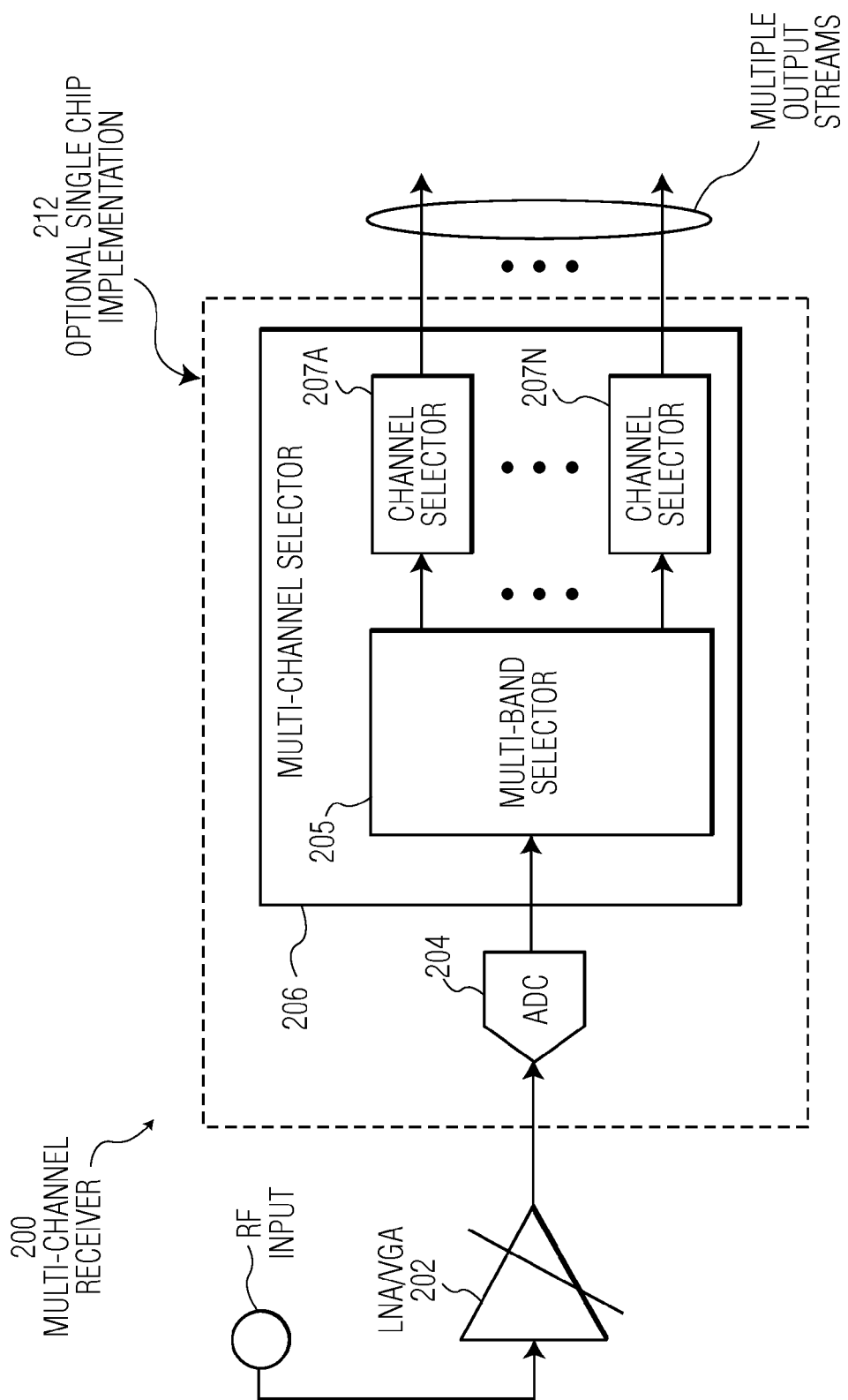
FIG. 2 is a block diagram of illustrating logical components of a multi-channel receiver according to an embodiment.

In an embodiment, a multi-channel receiver uses an analog to digital converter (ADC) and a high speed multi-band selector (MBS) to provide a selectable multi-channel output to an external device. In another embodiment the ADC and the MBS are implemented on a single IC. In this embodiment, data are transported at very small distances on-chip in a synchronized manner. The IC receiver outputs only the pre-selected channel information at a significantly lower data rate (e.g. 10 MSample/sec instead of 2 GSample/sec) thereby mitigating electromagnetic compatibility (EMC) issues. FIG. 2 illustrates the logical components of a multi-channel receiver (MCR) according to an embodiment.

MCR 200 comprises LNA/VGA 202, ADC 204, and multi-channel selector 206. Multi-channel selector 206 comprises multi-band selector 205 and channel selectors 207A-207N. Depending on the number of channel selectors that are implemented in multi-channel selector 206 will determine the number of output streams that will be available. In an embodiment, each output stream represents a channel that may be further processed by a decoder (not illustrated). In an embodiment LNA/VGA comprises a power versus frequency equalizer. A composite broadband RF input signal (e.g. a cable TV signal consisting of multiple channels bundled together between 50-1000 MHz) is received at LNA/VGA 202 from a signal source. Here, the signal is pre-conditioned (amplified, filtered, potentially also equalized). The output of LNA/VGA 204 subsequently it is digitized in its entirety with an ADC 204. No frequency translation and no selectivity take place at this stage.

The output of ADC 204 comprises a multi-channel digital signal. This digital signal is presented to a multi-channel selector 206 that allows specific bands within the digitized streams to be selected for further filtering by channel selectors 207. As illustrated in FIG. 2, ADC 204 and multi-channel selector 206 may be optionally combined on a single chip 212. In another embodiment (not illustrated), the additional components of multi-channel receiver 200 may be incorporated on the chip with ADC 204 and multi-channel selector 206.

Figure 3:
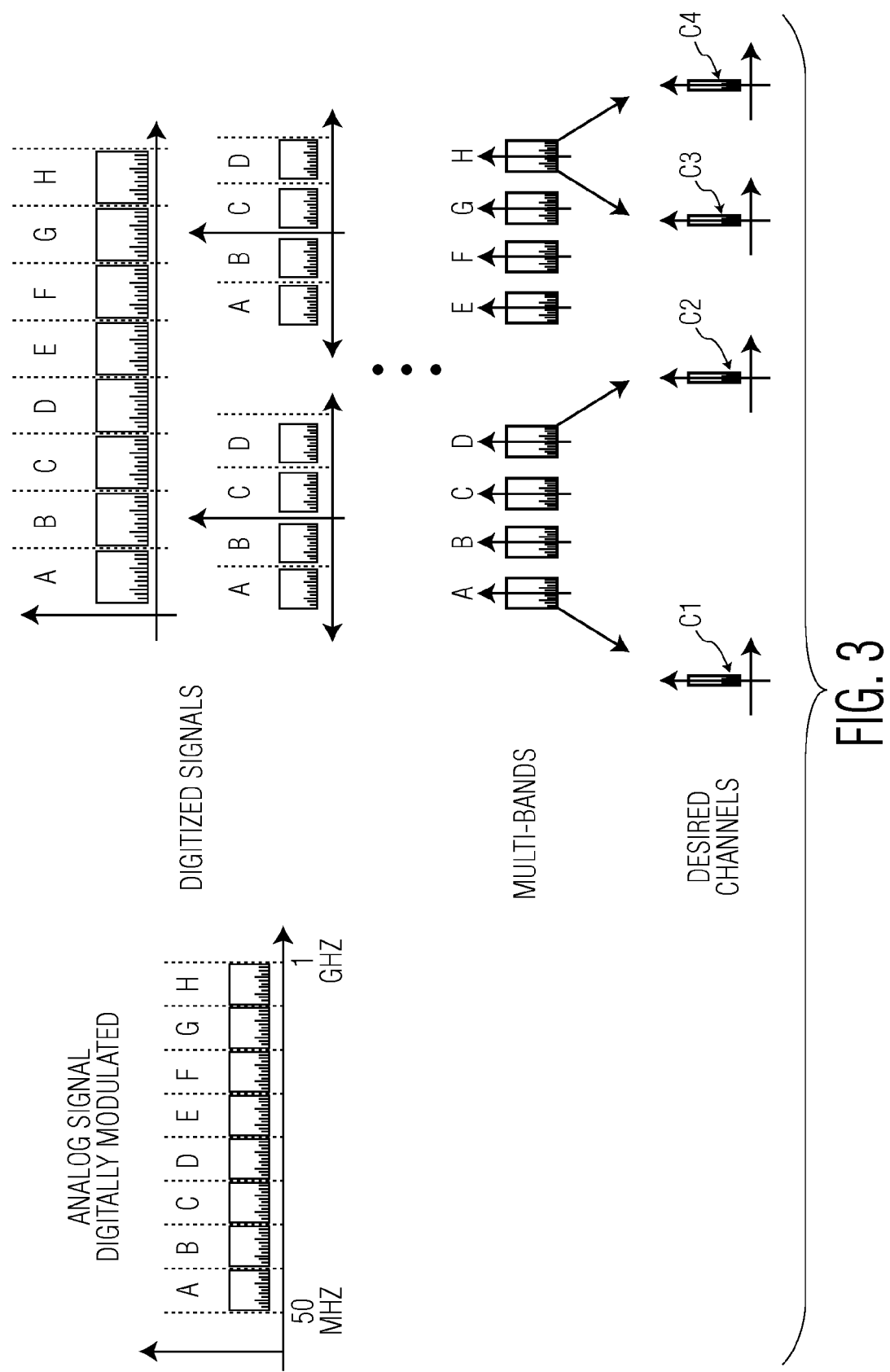
FIG. 3 illustrates the flow of a multi-channel receiver using a multi-band, multi-channel selector according to an embodiment.

As will be described in detail below, multi-band selector 205 and channel selectors 207A-207N may be configured to perform a two-step channel selection process. The multi-band selector 205 receives the ADC output and splits it hierarchically and with spectral overlap into a number of "L" spectral sub-bands (e.g. A . . . H as illustrated in FIG. 3 below). Each of these sub-bands contains a portion of the original received TV band and runs at a frequency rate Fs/L compared to the original. As such, the multi-band selector realizes a coarse "channel" selection without any information loss.

The channel selectors 207 realize a fine channel selection. Each sub-block 207A-N receives any of the L sub-bands, selects one channel only and delivers it at the output. The number of channel selectors determines the number of simultaneously received TV channels at the output. For example, using 16 channel selectors permits 16 channels contained in the original TV band to be received simultaneously.

FIG. 3 illustrates a process flow within a multi-channel receiver according to an embodiment.

A composite broadband RF input signal (e.g. a cable TV signal consisting of multiple channels bundled together between 50-1000 MHz) is received from a signal source and digitized as described above. The digitized equivalent of the composite broadband RF signal (left side of FIG. 3) is subsequently split in the frequency domain into a set of sub-signals. By way of illustration and not as a limitation, the composite signal is split into the sub-bands A . . . H in FIG. 3) that contain all of the TV channels of the original signal in a parallel format using an multi-band selector of a multi-channel decoder (see, FIG. 2, 205).

Because the whole RF signal is sampled, no channel information is lost in the RF signal pre-processing (no selection in the RF domain).

One of the current realization issues of the approach described above is that it requires sampling and quantization of signals with GHz bandwidth with proportionally larger sampling rates and with very high dynamic range (e.g. 50-70 dB). State-of-the-art converters in both open literature and consumer electronic companies have yet to reach this level of performances. A second major issue is the capability to process digital signals with very high data rates.

For example, assume that the input signal is a cable TV signal consisting of multiple channels bundled together between 50-1000 MHz. In order to digitize this bandwidth, a sampling rate of 2 GS/sec is needed which produces a data rate of 20-80 Gbits/sec. The steepness of the digital filters required in order to isolate one 6 MHz channel out of 100 TV channels in the 1 GHz band at the aforementioned rate complicates the situation significantly. Conventional digital signal processing selectivity techniques are not able to deal with these issues with area and power efficiency at reasonable levels for commercial use. The resulting on-chip interference generated by the activity of such a filter is also a great concern for the proper operation of the ADC and RF amplifier.

Figure 4:
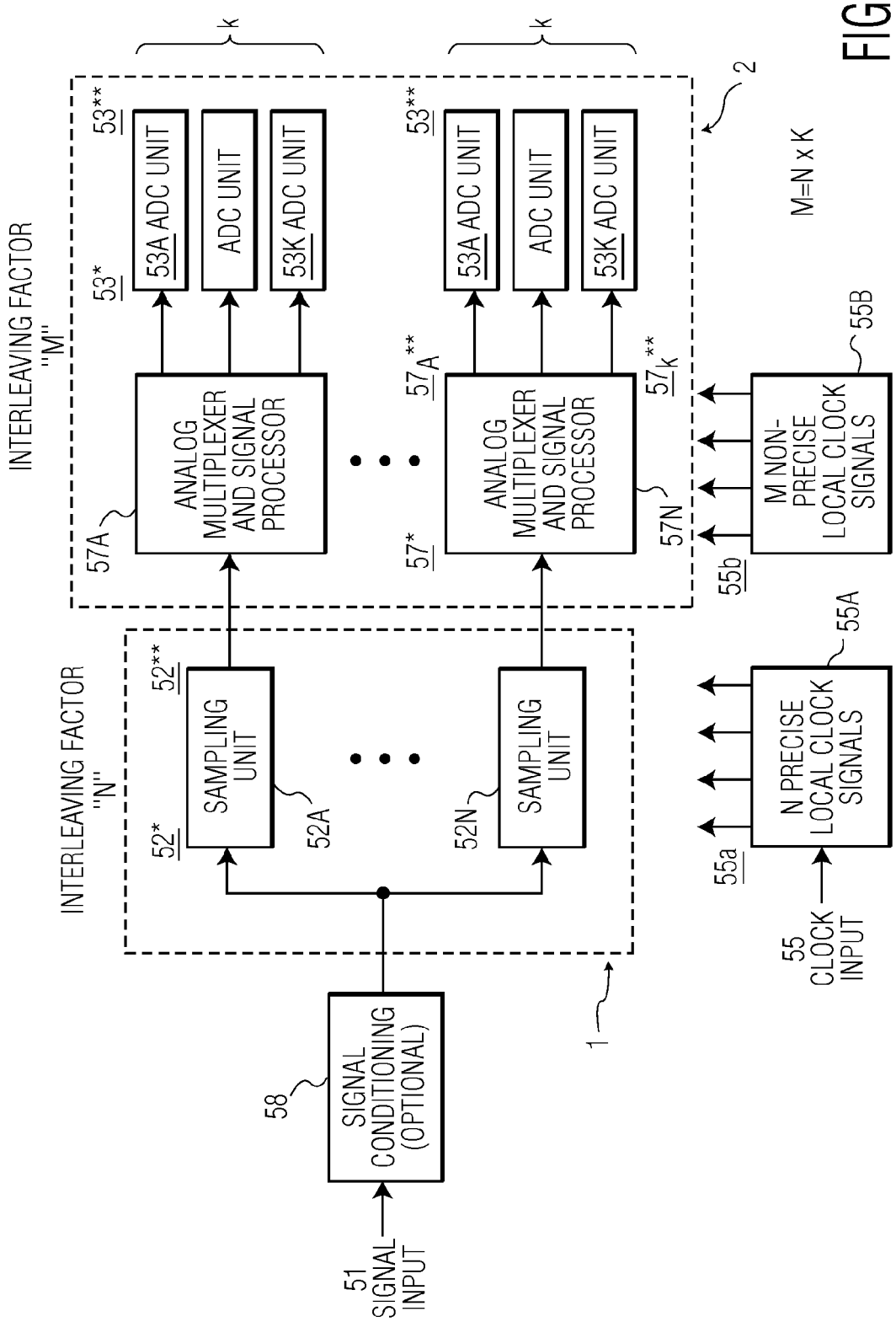
FIG. 4 illustrates a block diagram of the logical components of a partitioned time interleaving analog-to-digital converter architecture according an embodiment.

In an embodiment, ADC 204 is a partitioned time interleaving analog to digital converter. FIG. 4 illustrates a block diagram of the logical components of a partitioned time interleaving analog-to-digital converter architecture according an embodiment. ADC 204 comprises a main signal input 51 for inputting an analog signal into the circuit. It further comprises a front-end circuitry 1 and a back-end circuitry 2. In turn, the front-end circuitry 1 comprises a plurality of N sampling units 52A, . . . , 52N each having a signal input 52* and a signal output 52**, wherein the signal input 52* of each of the N sampling units 52A, . . . , 52N is connected to the main signal input 51. Presently, a signal conditioning unit 58 is interposed between the main signal input 51 and the respective signal inputs 52* of the N individual sampling units 52A, . . . , 52N of the front-end circuitry 1. The signal conditioning unit 58 may comprise a copier and/or a buffer. Signal conditioning units 58 of the kind used in the present converter architecture are well known in the art.

In an embodiment, the back-end circuitry 2 comprises a plurality N of analog demultiplexers 57A, . . . , 57N each having an signal input 57* and a group of signal outputs 57A, . . . 57K and a plurality N of groups of ADC units 53A, . . . , 53K, wherein each ADC unit 53A, . . . , 53K has a signal input 53* for an analog signal and a data output 53** for binary data. Presently, the groups of ADC units 53A, . . . , 53K each contain the same number K of ADC units 53A, . . . , 53K. Correspondingly, the total number of ADC units 53A, . . . , 53K in the back-end circuitry 2 of the ADC converter architecture is M=N*K. The demultiplexers 57A, . . . , 57N and the ADC units 53A, . . . , 53K are interconnected in such a way that the signal outputs 57A, . . . 57K of each demultiplexer 57A, . . . , 57N are connected to the signal inputs 53* of the ADC units 53A, . . . , 53K of one group of ADC units 53A, . . . , 53K. What is more, the demultiplexers 57A, . . . , 57N of the back-end circuitry 2 each comprise an additional signal processing circuit. In turn, these signal processing circuits may comprise a buffer and/or a follower and/or an amplifier.

In this embodiment, the analog-to-digital converter architecture comprises a clock input 55 configured to provide a first plurality of clock signals 55a clocking the plurality of sampling units 52A, . . . , 52N and a second plurality of clock signals 55b clocking the plurality N of groups K of ADC units 53A, . . . , 53K. Each clock signal of said the first plurality of clock signals 55a has a first degree of precision and each clock signal 55b of said second plurality of clock signals has a second degree of precision. Presently, the first degree of precision exceeds the second degree of precision since only the N sampling units 52A, . . . , 52N of the front-end circuitry 1 require a precise clock signal, whereas the digitization partition of the analog-to-digital circuitry, i.e. the back-end circuitry 2 including the N groups of K ADC units 53A, . . . , 53K allows for using a clock signal that is less precise. It should be noted that the sampling behavior for all members of the same ADC group is identical (the same timing error). Therefore relative timing errors within such a group do not exist.

Not shown in FIG. 4 is a data recombination unit that is configured to recombine the data being output by the data outputs 53** of the ADC units of said plurality N of groups of K ADC units 53A, . . . , 53K so as to generate a one-dimensional digital data stream.

The partitioned time interleaved analog-to-digital converter according operates as follows:

A signal source (not shown) provides an analog signal to the respective signal inputs 52* of the N sampling units 52A, . . . , 52N via the signal conditioning unit 58 (the effect of the signal conditioning unit should be briefly described). The N sampling units 52A, . . . , 52N of the front-end circuitry 1 make samples of the analog signal at the required sampling rate Fs using time interleaving by factor N determined by the number of sampling units 52A, . . . , 52N. The sampled signals of the N sampling units 52A, . . . , 52N of the front-end circuitry 1 are each linked to the correct ADC units 53A, . . . , 53K of the N groups of ADC units where they are converted to digital data using time interleaving (factor M). Although the back-end interleaving factor M exceeds factor N of the front-end interleaving (i.e. M>N) the partitioning of the ADC architecture allows for the necessary timing correction between the individual ADC units of the back-end circuitry 2 to be reduced to the correction of N errors—N being the number of groups of ADC units 53A, . . . , 53K—since the sampling behavior for all members of the same group of ADC units 53A, . . . , 53K is identical and relative timing errors within one group do not exist.

It should be noted that the partitioning between two interleaving domains can be reflected also on the actual placement of the units on chip, with critical components being close to each other (sampling units) and non-critical ones far away without major penalties.

Partitioning provides advantages time interleaving ADCs known from the prior art. Power and area efficiency limitations of standard ADC units lead to the use of many of those units in a time interleaved (multiplexed) manner to increase the performance and efficiency of the conversion function. However, this solution requires that many units are physically connected in parallel (but operated in alternate) and eventually results in: (a) bandwidth limitations at the sampling front-end node due to interconnect; (b) large number of individual ADC units and samplers that make timing and other corrections complex, and which introduces even larger timing errors.

In the architecture of ADC 204, the standard time interleaving sampling and digitization is partitioned in two main parts. The front-end sampling and the back-end digitization operations are assigned different interleaving factors N, M optimized for the requirements of those partitions. The sampling partition (front-end circuitry 1) relates to precise timing and front-end signal bandwidth aspects. The digitization partition (back-end circuitry 2) relates to the internal bandwidth/dynamic-range/power tradeoff of each ADC unit 53A, . . . , 53K.

The partitioned architecture of ADC 204 results in relaxed bandwidth limitations of the associated front-end circuitry compared to standard Time Interleaved ADC and reduces substantially the complexity of corrections associated with timing errors (dominant limitation at high speeds). It also improves significantly on power consumption efficiency because the architecture of ADC 204 allows the use of ADC units to be interleaved that are not pushed at extremes of speed and power consumption as in the standard design. This comes without penalties on speed and timing error correction complexity that typically associate with the use of many ADC units in parallel.

The output of ADC 204 is provided to multi-band selector 205 in multi-channel selector 206 (see FIG. 2). In principle, the digital signal selection process could be implemented with conventional methods for digital selection. For example, one could translate the RF single channel selection method (frequency translation with an analog mixer to select the single wanted channel, filtering, etc.), in its direct digital equivalent (frequency translation of one channel with digital mixers, filtering and decimation, etc.), and thus select one channel out of many available. Then, replicating this digital tuner one can realize a multi-channel digital selection processor. This direct translation of the RF equivalent would lead however to a highly inefficient solution with significant complexity and area-power costs.

Figure 5:
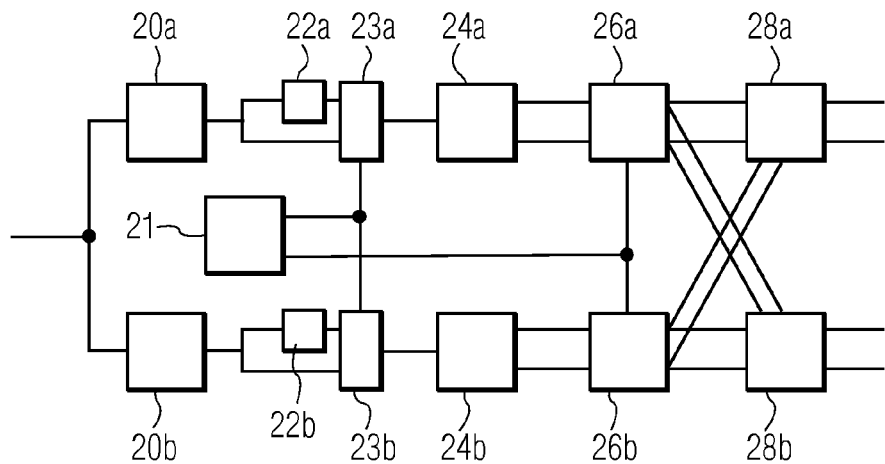
FIG. 5 is a block diagram illustrating an architecture of a representative stage of multi-band selector according to an embodiment.

Multi-band selector 205 in multi-channel selector 206 produces signals that represent respective frequency bands of composite broadband RF input signal. FIG. 5 is a block diagram illustrating an architecture of a representative stage of a multi-band selector 205 in multi-channel selector 206 according to an embodiment. The illustrated stage comprises a first and second sub-sampler 20a,b, a phase position indicator 21, a first and second inverter 22a,b, first and second multiplexers 23a,b, first and second filters 24a,b, first and second combiners 26a,b and first and second adding circuits 28a,b. An input of the digital multi-band selector, which may be coupled to the output of analog to digital conversion circuit 204 (see, FIG. 2) via appropriate condition circuitry is coupled to inputs of first and second sub-sampler 20a,b, respectively. First and second sub-sampler 20a,b have outputs coupled to inputs of first and second multiplexers 23a,b each directly and via a respective one of the inverters 22a. Phase position indicator 21 is coupled to control inputs of first and second multiplexer 23a,b. First and second multiplexer 23a,b have outputs coupled to first and second filters 24a,b. First and second filters 24a,b each have two outputs. The outputs of first filter 24a are coupled to inputs of first combiner 26a. The outputs of second filter 24b are coupled to inputs of second combiner 26b. Phase position indicator 21 has an output coupled to control inputs of second combiner 26b. Outputs of first and second combiners 26a,b are coupled to inputs of first and second adding circuits 28a,b. First and second adding circuits 28a,b have outputs coupled to the further processing circuits (not shown).

Data that represents digital samples values is supplied at a basic sample frequency Fs to the digital multi-band selector. One half the sample values, those for even sample time points is forwarded by first sub-sampler 20a. The other half of the sample values, those for odd sample time points is forwarded by second sub-sampler 20b. First and second sub-sampler 20a,b forward the samples at half the basic sample frequency Fs/2. Formally, the first and second sub-sampler 20a,b may be considered to be identical circuits, except that second sub-sampler 20a,b is preceded by a delay element that delays the samples by one cycle of the basic sample frequency Fs, although of course the same effect can be realized by clock filtering.

Phase position indicator 21 controls first multiplexer 23a to selectively pass inverted and non-inverted sample values according to a cyclic pattern (1,−1,−1, 1), wherein a sample values in every fourth cycle of the sub-sampled frequency is not inverted, the next two sample values are inverted and the subsequent sample value is not inverted. Thus, if the output sample values from sub-sampler 20a are called U, as a function of an index indicating the cycles of sub-sampled sample frequency (so that U(0) is the sample value in a first cycle, U(1) in the next cycle and so on), and the output signals of the first multiplexer 23a are called X as a function of an index then:

$X(4*m)=U(4*m),$ $X(4*m+1)=-U(4*m+1)$ $X(4*m+2)=-U(4*m+2)$ and $X(4*m+3)=U(4*m+3)$ Phase position indicator 21 controls second inverter 22b according to the same pattern.

Figure 6A:
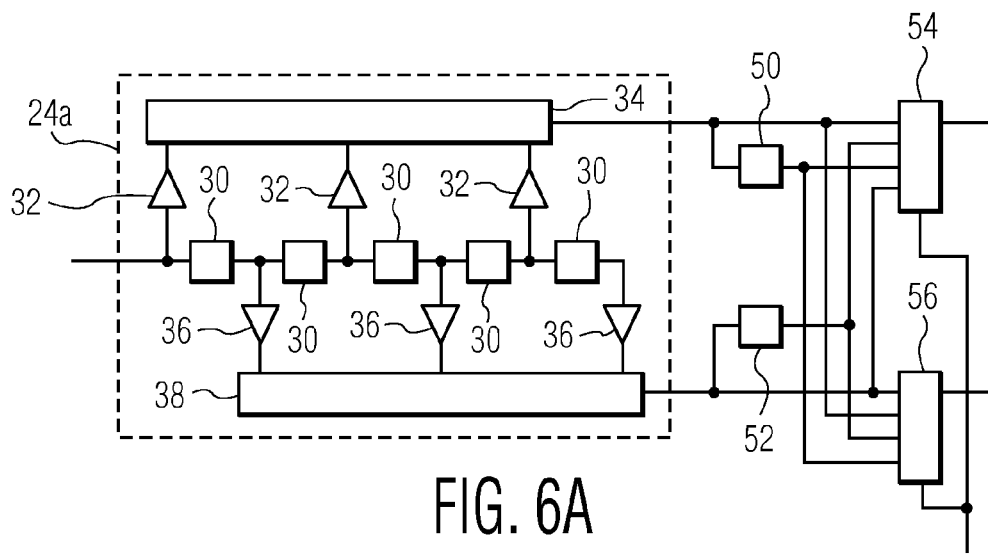
FIG. 6A is a block diagram illustrating the logical components of a first or second filter according to an embodiment.
Figure 6B:
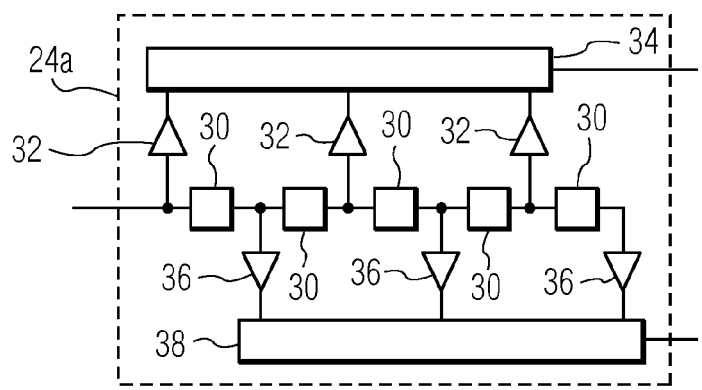
FIG. 6B is a block diagram illustrating the logical components of a first or second filter according to an embodiment

FIG. 6B is a block diagram illustrating the logical components of a first or second filter according to an embodiment. First filter 24a comprises a pair of FIR filters that share a chain of tap circuits 30. The first FIR filter comprises first coefficient multipliers 32 and a first adder 34. The second FIR filter comprises second coefficient multipliers 36 and a second adder 38. Outputs of the tap circuits 30 at odd positions in the chain are coupled to inputs of the first coefficient multipliers 32. Outputs of first coefficient multipliers 32 are coupled to inputs of first adder 34. Outputs of the tap circuits 30 at even positions in the chain are coupled to inputs of the second coefficient multipliers 36. Outputs of second coefficient multipliers 36 are coupled to inputs of second adder 38. Thus, the first filter 24a is configured to compute two sums of products of filter coefficients He(m), Ho(m) and selectively inverted sample values X from a sliding window of samples. The filter coefficients He(m), Ho(m) are non zero only for a finite range of index values "m" and coefficient multipliers 32, 36 are provided only for those index values. The two outputs Y1(n), Y2(n) of the filter at a sampling cycle indexed by "n" is:

$Y1(n)=$sum over $m$ of $He(m)*X(n-2m)$ $Y2(n)=$sum over $m$ of $Ho(m)*X(n-2m-1)$ The products correspond to the operations of coefficient multipliers 32, 26. The number of m values over which the sum is taken, i.e. the range outside which He(m) and Ho(m) are effectively zero and the length of the chain of tap circuits, depends on the filter used. Second filter 24b has a similar structure as first filter 24a. Although an example with three taps and corresponding multiplications for each FIR filter has been shown, it should be appreciated that this is merely an example greater or smaller numbers of taps may be used for the FIR filters. Nor need the number of taps be the same for both FIR filters. Thus, the set of sub-sample values that are applied to the first FIR filter may be the same as the further set of sub-sample values that are applied to the second FIR filter with one sub-sample cycle delay, or the set and the further set may be different, containing some overlapping sub-sample values but also sub-sample values that are not present in the other set.

Figure 7:
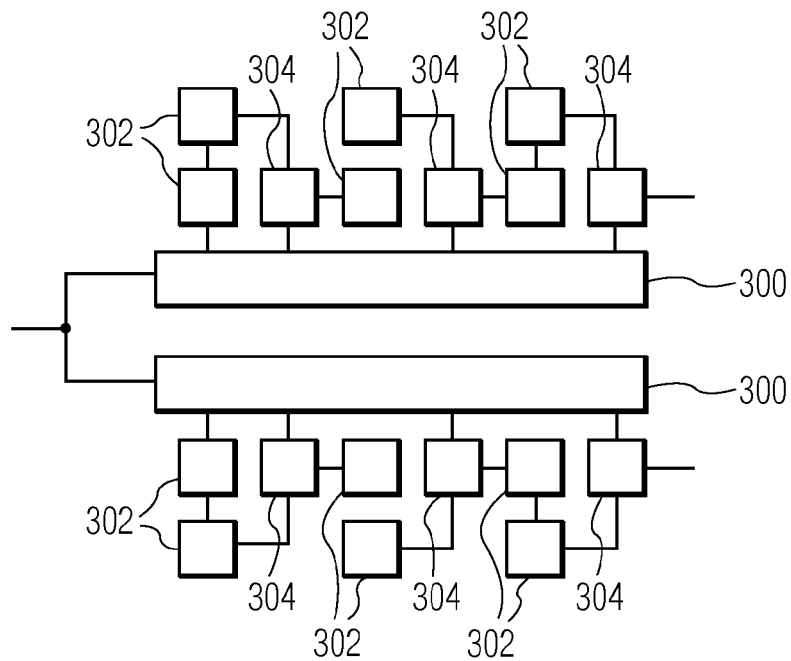
FIG. 7 is a block diagram illustrating the logical components of a first or second filter according to an embodiment.

FIG. 7 is a block diagram illustrating the logical components of a first or second filter according to an embodiment. In this embodiment, the multiplication of a single signal value X with different coefficients He(m) or Ho(m) is performed at the same time in a multiplication circuit 300. Use of a multiplication circuit for performing the multiplication of a single sample value with different coefficients has the advantage that similarities between the coefficients can be exploited to reduce the required amount of computation. Thus, for example, identical parts f of different coefficients H(i)=f+fi and Ho(j)=f+fj may be multiplied once with a sample value X, for multiple use of the product f*X in the computation of products H(i)*X, H(j)*X with different complete coefficients H(i), H(j). The outputs of the multiplication circuit 300, which output product H(m)*X(n) at a time "n" for example if different outputs are labeled y "m", are coupled to delay circuits 302 and adders. Delay circuits 302 delay part of the input to adders 304. The delay circuit 302 ensure that each product H(m)*X(n) contributes to an eventual sum circuit with a delay according to the output m of the multiplication circuit 300 at which it is produced. As a result adder 304 forms the sum over m of H(m)*X(n−m). In the embodiment, intermediate sums are formed, using successive delays of two cycles. Everywhere where FIR filters of the type shown in FIG. 6b are used, using tap circuits, coefficient multipliers and an adder, any FIR filter may be replaced by a FIR filter of the type shown in FIG. 7.

First combiner 26a is configured to forward output values Y1, Y2 from the two FIR filters alternately to a first and second output respectively in odd cycles and to the second and first output respectively in even cycles. That is, if the output signals of first combiner 26a in cycle n are called Z1(n), Z2(n), then Z1(n)=Y1(n) and Z2(n)=Y2(n) for even n and Z1(n)=Y1(n) and Z2(n)=Y2(n) for odd n.

Figure 8:
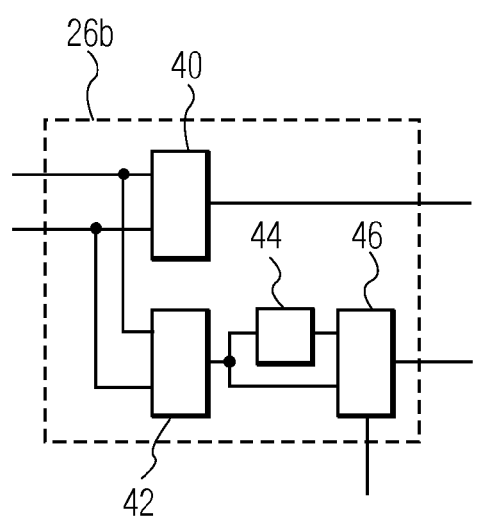
FIG. 8 is a block diagram illustrating the logical components of a second combiner according to an embodiment.

FIG. 8 is a block diagram illustrating the logical components of a second combiner according to an embodiment. Second combiner 26b comprises an adder 40 and a subtractor 42, and inverter 44 and a multiplexer 46. Adder 40 has inputs coupled to both of the outputs Y1', Y2' of second filter (not shown) and an output coupled to a first output of second combiner 26b, for outputting the sum values Y1'(n)+Y2'(n). Subtractor 42 similarly has inputs coupled to both of the outputs of second filter (not shown). An output of subtractor 42 is coupled to a first input of multiplexer 46, and to an input of inverter 44, which has an output coupled to a second input of multiplexer 46. Subtractor 42 is configured to for difference values Y2'(n)−Y1'(n). In even cycles (n is even) multiplexer 46 passes the difference Y2'(n)−Y1'(n) of the output values Y1'(n), Y2'(n) from the second filter and in odd cycles multiplexer 46 passes the inverse Y1'(n)−Y2'(n) of the output values.

First adding circuit 28a adds the values produced at the first outputs of first and second combiner 26a,b and it adds the values produced at the second outputs of first and second combiner 26a,b. The results form a real and imaginary part of a signal representing a first sub-band. Second adding circuit 28a subtracts the values produced at the first outputs of first combiner 26a from the values produced at the first outputs of second combiner 26b and it subtracts the values produced at the second outputs of second combiner 26b from the values produced at the second outputs of first combiner 26a. The results form a real and imaginary part of a signal representing a second sub-band.

It may be noted that the multi-band selector may be replaced by a single band selector if only one band is needed at a time. A single band selector may be realized by omitting one of the adding circuits 28a,b. The single band selector may be made tunable, by providing for switching between adding and subtraction, i.e. the operation of first and second adding circuit 28a,b.

The band splitting effect of the multi-band selector 205 in FIG. 2 may be explained as follows. A stream of digital samples S(k) values sampled at a sampling frequency of Fs may be considered to represent spectral components in a frequency band from −Fs/2 to Fs/2. To select a sub-band the sample values S(k) may be multiplied with a complex signal exp{−jwk}, wherein w represents a frequency (or equivalently a phase increment) and subsequently low pass filtered, using a finite impulse response filter with coefficients H(m), after which the filtered signal may be sub-sampled.

This multiplication, filter sub-sampling operation may be implemented in two parallel branches, each operating at half the sample frequency, each for a respective phase in successive cycles of two sample values in the input signal, i.e. for even and odd values of k respectively. The two branches have input signals Xa(n), Xb(n) with Xa(n)=S(2*n) in the first branch and Xb(n)=S(s*n+1) in the second branch. Multiplication and filtering of the input signals would produce signals Za, Zb according to:

$$Za(n) = \text{sum over } m \text{ of } Ha(m)*Xa(n-m)*\exp\{-j2w(n-m)\} \text{ and}$$

$$Zb(n) = \text{sum over } m \text{ of } Hb(m)*Xb(n-m)*\exp\{-j2w(n-m)\}*\exp(-jw)$$

Herein the filter coefficients Ha, Hb, are coefficients H from the low pass filter at even and odd phase positions respectively. The result of multiplying, filtering and sub-sampling the signal S can be reconstructed by adding Za(n)+Zb(n). Moreover, it may be noted that Za and Zb computed for a frequency w can readily be used to obtain a similar result for frequencies w'=w+pi, w'=2*pi−w and w'=pi−w. A replacement of w by 2*pi−w results in taking the complex conjugate of Za and Zb. Thus the sum of these conjugates of Za and Zb computed for w correspond to the result of mixing with this frequency, filtering and subsampling at w'=2*pi−w. Similarly, replacement of w by w'=w+pi only affects the factor exp(−jw). Therefore the result of multiplying with a local oscillator signal with frequency w'=w+pi, filtering and sub-sampling the signal S can be obtained from Za−Zb. Taking the difference of the conjugates corresponds to using a frequency w'=pi−w.

Even though the input signal values Xa, Xb and the filter coefficients H(m) are real, the exponent exp{−j2w(n−m)} will necessitate use of real and imaginary parts. As a result the summations really involve two summations, of real and imaginary parts respectively. Similarly the multiplications involve computation of multiple multiplications to compute real and imaginary parts.

However, when the special frequency w of pi/4 is chosen, the exponent exp{−j2w(n−m)} only takes values 1,−j, −1, j. This means that half the products Xa(n−m)*exp{−j2w(n−m)} have zero imaginary part and the other half have zero real part. Therefore, the multiplications with the real filter coefficients Ha(m), Hb(m) involving these zero parts may be omitted. Moreover, as the multiplications with the exponent exp{−j2w(n−m)} merely involve multiplications with plus or minus one, they may be replaced by selectable inversion.

This may be applied by implementing the multiplication with exp{−j2w(n−m)} by selective use of an inverter 22a. Furthermore this may be applied in first filter 24a by multiplying each time only part of the inverted or not inverted signal values Xa with a part of the filter coefficients Ha(m), for selected m values, to compute the real part of Za. Similarly, another part of the signal values Xa may be multiplied with the other part of the filter coefficients Ha(m), for other m values, to compute the imaginary part. As will be appreciated, this considerably reduces the required amount computation.

The respective parts of the filter coefficients Ha(m) change role for even and odd values of n. In even cycles a first part of the filter coefficients Ha(m) is used to compute the real part of the output values and in odd cycles a second, remaining part of the filter coefficients Ha(m) is used to compute the real part of the output values Za. Conversely, the first and second parts of the coefficients are used for the imaginary part in odd and even cycles respectively. The first and second parts of the filter are implemented in the first and second FIR filter of the first filter 24a. The change of role is implemented using first combiner 26a, under control of phase position indicator 21.

In principle one would expect that two multipliers (implemented as inverters) are needed to produce the real and imaginary parts of the products $Xa(n-m)*\exp\{-j2w(n-m)\}$. However, it may be noted that the signs of the values $1,-j,-1,j$ of $\exp\{-j2w(n-m)\}$ are either entirely real or entirely imaginary and change in the same way for the real and imaginary parts, with one sample delay. This may be used to avoid use of separate inversions for obtaining the real and imaginary parts of the product and to combine the chains of tap circuits 30 for the real and imaginary parts. This further reduces circuit complexity. In order to do so, phase position indicator 21 makes first multiplexer 23a follow an inversion pattern of 1, −1, −1, 1, so as to produce real and imaginary parts of the product alternatively at the same output.

A similar, be it slightly more complicated insight may be applied to second filter 24b and second combiner 26b, which are used to compute Zb. Here, the difference is the factor $\exp(-jw)$ for the w value of pi/4 this factor takes on complex values of plus or minus one plus or minus j, divided by the square root of two. The need to divide by this square root can be eliminated by modifying the filter coefficients Hb to modified coefficients Hb' by dividing the original filter coefficients Hb by the square root in advance. Rounding errors in this modification may be selected to minimize resulting spurious signals.

This leaves a multiplication by a factor 1+j which is implemented by second combiner 26b, together with the change of role of real and imaginary parts of signals at even and odd phase positions. As may be noted this merely involves addition and subtraction in combination with phase dependent inversion. This reduces the required amount of computation.

The selected special frequency w of pi/4 corresponds to a frequency of one eight of the sampling frequency Fs. Thus, the multi-band selector implements a filter that selects signal components in a band centered at one eight of the sampling frequency Fs. As noted, the differences of the conjugates corresponds to using a local oscillator frequency w'=pi-w, i.e. 3 pi/4. Therefore second adding circuit 28b selects signal components in a band centred at three eights of the sampling frequency Fs.

In an embodiment the filter coefficients of filters 24a,b are derived so that they correspond to a low pass filter with a passband whose width exceeds one eight of the sampling frequency Fs by at least as much as a channel width of transmission channel that further processing circuits 16 are configured to decode. The extension is less than one eight of the sampling frequency Fs, so that the total width is less than Fs/4. This is possible without loss of information because a bandwidth of one eight of the sampling frequency Fs still satisfies the Nyquist sampling theorem. As a result of using the extended band, there is an overlap between the sub-bands output by first and second adding circuit 28a,b. This prevents that a channel become undecodable when it is located at the boundary between the bands.

Although a specific embodiment has been described, it should be noted that various modified implementation may be considered that achieve a similar result. For example, the inverter 22a,b and multiplexer 23a,b may be omitted if a corresponding change is made in filters 24a,b and combiners 26a,b.

FIG. 6A shows an embodiment along these lines. This embodiment is based on the observation that the sum over m of:

$Ha(m)*Xa(n-m)*\exp\{-j2w(n-m)\}$ can be rewritten as a product of $\exp\{-j2wn\}$ and sum over m of:

$[Ha(m)\exp\{j2wm\}]*Xa(n-m)$

When a frequency w=pi/4 is used (i.e. one eight of the sample frequency Fs), this corresponds to the sums of:

$Ha(m)*(-1)^{m/2}*Xa(n-m)$ for even m $j*Ha(m)*(-1)^{(m-1)/2}*Xa(n-m)$ for odd m This may be applied by feeding the output of sub-sampler 20a directly to a filter as shown in FIG. 6B or FIG. 7, where now the different FIR filters have coefficients $Ha(m)*(-1)$ m/2 for even m and $Ha(m)*(-1)(m-1)/2$ for odd m. The FIR filters produce the real and imaginary parts of the sum respectively. In this embodiment first combiner 26a is replaced by a combiner that implements the multiplication by the factor $\exp\{-j2wn\}$. The modified combiner comprises inverters 50, 52 for inverting the real and imaginary parts of the filter output and multiplexers for selecting between the real and imaginary parts of the filter output and their inverses to implement the multiplication with $\exp\{-j2wn\}$ (which is j to the power n).

A similar implementation may be used for the second branch of the circuit, omitting the second inverter 22b and second multiplexer 23b of the multi-band selector and replacing the second filter and second combiner. In this case the factor of square root 2 is again assumed in the filter and the combiner implements the multiplication with (1+j) etc. in different phases.

As may be noted by comparing FIG. 6A with the combination of FIGS. 5 and 6B, performing the inversions in front of filters 24a,b, as shown in FIG. 5 reduces the required amount of computation.

Furthermore it should be noted that more than two branches may be used in the multi-band selector. This is based on the fact that the result of mixing and filtering a signal S, followed by sub-sampling with a factor P can be achieved by sub-sampling values Xq(m) for different phases q according to $Xq(m)=S(mP+q)$ and rewriting the result: sum over m of $H(m) \exp\{-jw(n-m)\} S(n-m)$ by a sum over the phase value q of terms Tq(n') (wherein $Hq(m')=H(Pm'+q))Tq(n')=$sum over $m'Hq(m')\exp\{-jwP(n'-m')\} Xq(n'-m') \exp\{-jwq\}$.

In the embodiment of the multi-band selector with more that two branches, each branch computes a term Tq(n') for a different phase value q. The terms may be added in various combinations to form different band signals.

Herein the frequency w may be selected as w=pi/(2*P). In this case each term Tq(n) can be rewritten as a factor $\exp\{-jwq-jwPn'\}$ times a sum over m' of:

$[Hq(m')(-1)^{m'/2}]Xq(n'-m')$ for even m', and $j[Hq(m')(-1)^{(m'-1)/2}]Xq(n'-m')$ for odd m'

These sums may be computed with filters such as shown in FIG. 6A. The factor $\exp\{-jwPn'\}$ can be implemented with the combiner as shown in this Figure. The factors $\exp\{-jwq\}$ for different branches may be implemented using multipliers, which leads to more computations than for the preceding example, wherein P=2. However when P is taken as a multiple of two, at least the branches for q=0 and q=P/2 can be implemented as shown in the preceding. Furthermore pre-mixing with a cycle of inversions/non-inversions 1,−1,−1, 1 may be used instead of the multiplication with $\exp\{-jwPn'\}$ behind the filter.

As will be appreciated, various components of the receiver circuit, such as subsamplers 20a,b, inverters 22a,b, multiplexers 23a, the chain of tap circuits 30, coefficient multipliers 32, 36, adders 34, 38, etc. may each be implemented as separate circuit components, coupled to other components by signal conductors to pass the bits that represent the digital sample values of the various signals. Alternatively combinations of two or more components may be implemented using signal processors programmed to perform the functions of the components in a time slot multiplexed fashion. As will be appreciated the possibility of such an implementation is limited by the sample frequency. At the very highest possible sample frequency little or no such time multiplexing is possible, particularly for the multiplications and additions. At lower sample frequencies or in circuit parts that operate at sub-sample frequencies more time multiplexing is possible. In language describing such multiplexed implementation execution of operations on sample values of any first signal "when", "at the same time as", "in parallel with" etc. operations on sample values of any second signal are performed, this should be taken to refer to operations performed on the first signal between operations on successive sample values of the second signal, or simultaneous with one of these operations.

Referring again to FIG. 4, in an embodiment, an array of K sub-ADC's is used, each being constructed as an array of M unit ADC's (ADC units). The sub-ADC's and ADC units in each sub-ADC are operated according to the Time-Interleaved algorithm with a different interleaving factor compared to each other. Each ADC unit operates at sampling rate $f_{unit}$ leading to rate of $M*f_{unit}$ for the ADC, and $K*M*f_{unit}$ for the whole converter. The resulting output is a parallel stream of K*M unit data streams with N bits each (corresponding to the resolution N of each ADC unit). This parallel stream of data equals in bit rate to that of a single ADC sampling at $fs=K*M*f_{unit}$. The total number of data streams can be grouped in one single stream of N bits at a rate of fs, although this is not always required.

The multi-band selector then receives the raw sampled and digitized data from the ADC in a parallel format (e.g. K=4 streams of 500 MSamples/sec for an effective sampling rate fs=2 GS/sec). In an embodiment, the selection method utilizes a multi-channel selector comprising two main circuit blocks. The first block is the multi-band selector. The multi-band selector receives the ADC output and splits it hierarchically and with spectral overlap in a number of L spectral sub-bands (e.g. A . . . H as illustrated in FIG. 3). Each of these sub-bands contains a portion of the original received TV band and runs at a frequency rate Fs/L compared to the original. As such, the multi-band selector realizes a coarse channel selection without any information loss.

The second block is the channel selector block. It realizes a fine channel selection. It receives any of the L sub-bands, selects one channel only and delivers it at the output. The number of channel selectors determines the number of simultaneously received TV channels at the output. For example, using 16 channel selectors one can receive any 16 channels contained in the original TV band simultaneously.

The multi-channel selection process can be most efficiently realized hierarchically as well, as it is shown conceptually in FIG. 3. According to this method, the original signal is broken step by step in smaller sub-signals, each occupying a smaller bandwidth than its hierarchically superior signal. As a result, for each next division the sample rate of each band decreases. The reduction in sampling rate has a significant impact in the improvement of power efficient similarly to the case of the mentioned ADC.

In conventional digital channel selection methods only one wanted channel is selected and the information of channels is lost in the selection process by design. In an embodiment, the processing is realized in two steps and the total signal information is kept complete until the very last step in the selection process.

First, the original high rate signal is translated into a set of sub-signals (equivalently, the sub-bands A . . . H in FIG. 3) that contain all of the TV channels of the original signal in a parallel format. Therefore no information loss takes place: for example, one signal at a rate of 2 GS/sec containing 100 6 MHz-wide TV channels between 50-1000 MHz is translated into 8 signals each containing a portion of 125 MHz of the original and running at 250 MS/sec. This translation reduces the signal rates substantially, with overall benefits in power consumption, reduced interference, etc.

The second step is the fine selection of the desired individual TV channels from the parallel signals streams (e.g., from A . . . H). In an embodiment, the fine selection step is driven using a selection device that is user accessible. For example, to select channel J, the proper sub-signal (A . . . H) is provided to the fine selection device and from this sub-signal the wanted channel is selected. Because of the hierarchical division of the original signal, the frequency of operation of the sub-signal A . . . H is so small that even conventional digital selection methods would suffice to realize the fine selection. In this way, any combination of the available channels of the original composite signal can be selected and delivered to the output. By replicating the fine selector, one can realize a multiplicity of digital tuners very efficiently.

The next step, after the reception and channel selection of multiple channels, is the channel decoding process. This is accomplished with a multi-channel baseband processor (not illustrated). For example, a multi-channel channel decoder 208 processes 16 TV streams simultaneously and delivers 16 transport streams for video. These can be further processed with channel and source decoders.

The combination of the RF pre-processing, the direct digitization, the multi-channel selection process and the multi-channel baseband processing realize a truly multi-channel receiver that delivers simultaneously many TV transport streams (e.g. MPEG streams). In an embodiment, the ADC and the multi-channel digital signal selection circuits are realized in CMOS technology. In this embodiment, the complete receiver is realized in one IC. (FIG. 2, dotted line indicating single chip implementation.) In an alternate embodiment, an integrated circuit comprises an ADC, a multi-band, multi-channel selector, and a multi-channel decoder. In still another embodiment, in integrated circuit comprises an RF front end (LNA/equalizer and mixer), an ADC, a multi-band, multi-channel selector, and a multi-channel decoder.

In another embodiment, the signal information contained in the multiple signals are used to affect the front-end (pre-processor and ADC) parameters such that the reception is optimal.

In accordance with this embodiment, the output of the multi-channel selection processor and/or the multi-channel baseband processor can be directly used and implemented in an information extraction processor to identify the power spectral density (PSD) shape of the signal captured by the ADC. A wide range of calculations for each TV channel can be realized this way. By way of illustration and not as a limitation, the signal may be analyzed for auto- and cross-correlations, histogram analysis, Bit-Error-Rate, Signal-to-Noise, and similar metrics of signal performance per channel, or per sub-band. This information can directly be used in various ways to improve the reception quality.

For example, a coarse PSD estimation can be made easily by calculating the power in each of the sub-bands A . . . H.

This provides enough information to realize basic automatic gain control or equalization at the RF pre-processor.

A fine PSD estimation can be made calculating the power per channel. The control means scan the complete TV band by receiving step by step all potential channel locations and identifies the power of the signal in each channel bin. This gives fairly accurate representation of the signal power distribution, and it also can be used to identify empty spots in the cable band (the band is not always and in every place in the world occupied fully with data and TV channels from cable provider companies) or interferer signals. This can form the basis of a method to make fast channel identification during the installation phase of the TV setup.

With a fine PSD estimation smarter and more accurate gain control loops can be implemented, i.e. control the amplification, filtering and equalization of the RF-pre-processor.

In an embodiment, one or more extra fine selectors next to the main selectors are used for normal TV operation with the specific function to monitor the received spectrum and its properties and adapt the reception quality accordingly.

Figure 9:
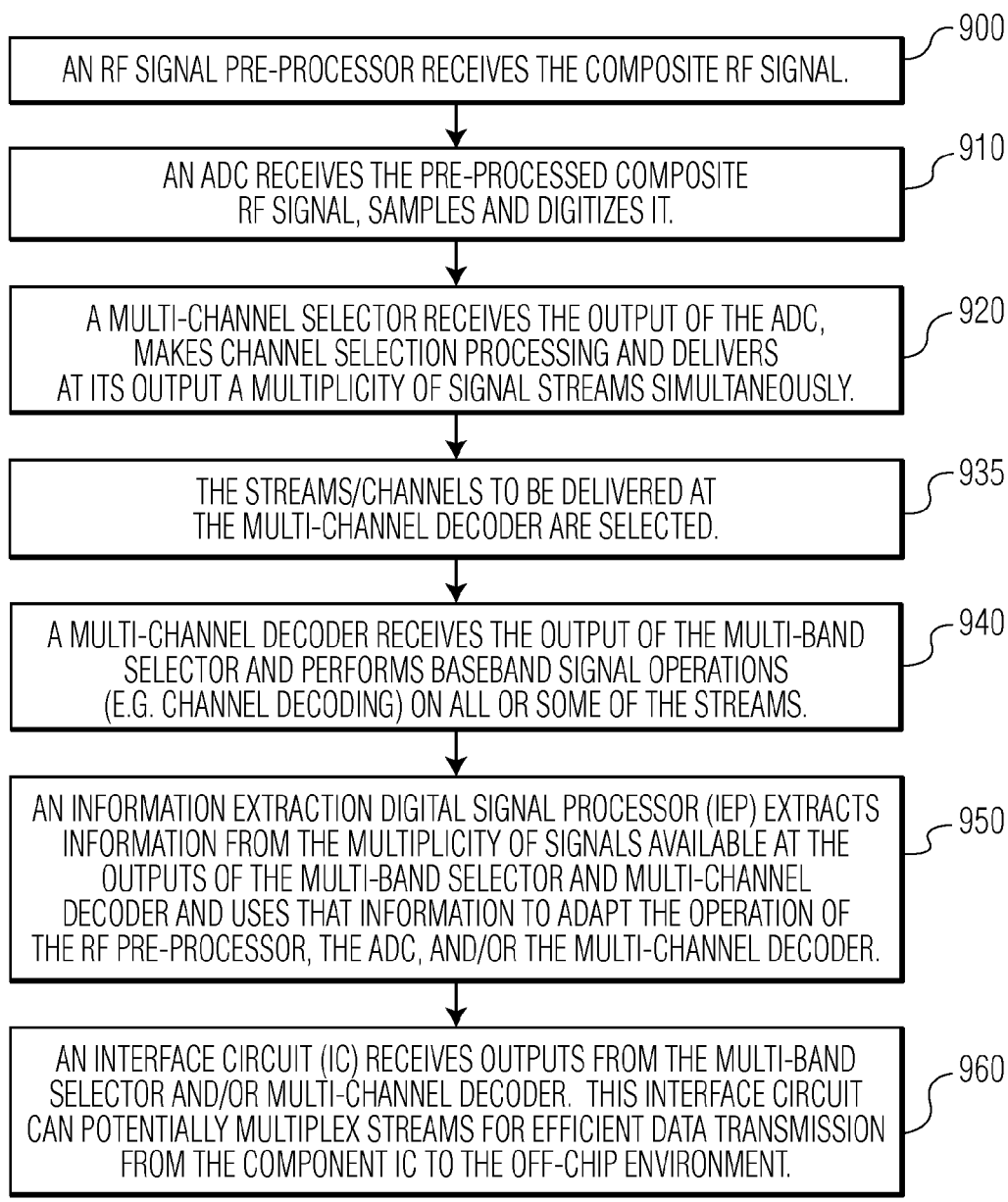
FIG. 9 illustrates a flow of a receiver according to an embodiment.

The flow of a receiver according to an embodiment hereof is illustrated in FIG. 9. For cable TV and data applications (e.g. for DOCSIS 3.0 and for DVB-C) the signal source coming out of a cable outlet is a single composite RF signal occupying typically the frequency band between 50-1050 MHz.

An RF signal pre-processor receives the composite RF signal 900. RF signal pre-processor amplifies the composite RF signal, filters it from other signals outside the TV band, and potentially equalizes the power of the signal at different frequencies. No frequency translation is realized. Programmable means are provided for control of the pre-processor properties (e.g. amplification).

An ADC receives the pre-processed composite RF signal, samples and digitizes it 910. The output of the ADC is thus a digital signal with all the information content present in the original RF TV signal.

A multi-band selector receives the output of the ADC, makes channel selection processing and delivers at its output a multiplicity of signal streams simultaneously 920. These concurrent signals correspond to multiple channels (or bands) contained in the same RF signal digitized by the ADC. Programmable means control the multi-band selector (e.g. for which channels to be delivered at its output).

Control means select the streams/channels to be delivered at the output of the multi-band selector and which streams are to be delivered at the output of the multi-channel decoder (for example to an interface that outputs the digital streams to the interface output) 935.

A multi-channel decoder receives all or some of the streams it receives from the multi-band selector 940. It outputs simultaneously the result of the baseband processing for further processing or for storing in memory means.

Optionally, an information extraction digital signal processor (IEP) extracts information from the multiplicity of signals available at the outputs of the multi-band selector and multi-channel decoder and uses that information to adapt the operation of the RF pre-processor, the ADC, and/or the multi-band selector 950.

An interface circuit receives outputs from the multi-band selector and/or the multi-channel decoder. This interface circuit can potentially multiplex streams for efficient data transmission from component ICs to the off-chip environment 960.

It will be understood by those skilled in the art that the present invention may be embodied in other specific forms without departing from the scope of the invention disclosed and that the examples and embodiments described herein are in all respects illustrative and not restrictive. Those skilled in the art of the present invention will recognize that other embodiments using the concepts described herein are also possible. Further, any reference to claim elements in the singular, for example, using the articles "a," "an," or "the" is not to be construed as limiting the element to the singular. It should also be appreciated that functionality ascribed to a device circuit herein may be provided by instructions that are incorporated into the device or that are provided to the device in the form of a software program. Additionally, it should be understood that a device that is described as "adapted" to perform a particular function may perform the function as an inherent consequence of its design, by executing instructions, or by virtue of a configuration of the device.

What is claimed is:

1. A multi-channel receiver comprising:
   an analog-to-digital converter (ADC) configured to convert using a sampling rate S an analog signal z which resides in a frequency band B Hz to a digital signal x, wherein digital signal x is representative of analog signal z; and
   a multi-band selector circuit configured to receive the digital signal x and to map the digital signal x into M time domain sub-signals $x_1 \ldots x_M$, wherein each sub-signal represents in a time domain a frequency domain content of digital signal x, wherein each sub-signal resides in a sub-range of band B, wherein each frequency component of digital signal x is represented at least in one of the sub-signals $x_1 \ldots x_M$ in its original form, and wherein each of the sub-signals $x_1 \ldots x_M$ has a sampling rate less than S, and the sub-ranges overlap.

2. The multi-channel receiver of claim 1, wherein the multi-band selector is further configured to map the digital signal x into M time domain sub-signals $x_1 \ldots x_M$ hierarchically.

3. The multi-channel receiver of claim 1 further comprising at least one channel selector connected to the output of the multi-band selector, and where in the channel selector is configured to select at least one channel out of any sub-signals $x_1 \ldots x_M$.

4. The multi-channel receiver of claim 1, wherein the multi-band selector circuit comprises at least two signal branches, wherein at least one branch is a filter-bank, and wherein at least one branch is a digital frequency translator connected to another filter-bank.

5. The multi-channel receiver of claim 3, wherein the sub-ranges overlap at least by an amount equal to a channel width of the at least one channel selector.

6. The multi-channel receiver of claim 1, wherein the multi-band selector circuit comprises a plurality of processing branches corresponding to respective phases and an adder for adding branch signals from the processing branches, wherein at least two of the plurality of processing branches comprise:
   a sub-sampler for sub-sampling sample values of the input signal at the phase corresponding to the branch;
   a block realizing sign inversion of the sub-sampled values cyclically;
   a filter comprising a first FIR filter, applied alternately to sets of sub-samples from the sub-sampler at even sub-sample positions and to sets at odd sub-sample positions, and a second FIR filter applied to further sets of sub-samples at odd and even sub-sample positions from the sub-sampler, when the first FIR filter is applied to the sets of sub-samples at even and odd sub-sample positions respectively; and a combiner for combining output samples from the first and second FIR filter into the branch signals of the branch according to a combination pattern that changes cyclically as a function of sub-sample position and is responsive to a phase of the branch.

7. The multi-channel receiver of claim 1, wherein the ADC is selected from the group consisting of a time-interleaved ADC and a partitioned time-interleaved ADC.

8. The multi-channel receiver of claim 1, wherein the ADC is a partition time-interleaved ADC comprising:
   a main signal input for inputting an analog signal into the circuit;
   a front end circuitry comprising a plurality (N) of sampling units each having a signal input and a signal output, wherein the signal input of each of the sampling units is connected to said main signal input;
   a backend circuitry comprising a plurality of demultiplexers each having a signal input and a group (K) of signal outputs;
   a plurality (N) of groups (K) of ADC units each ADC unit having a signal input and a data output;
   wherein:
   the signal output of each sampling unit is connected to the signal input of one demultiplexer of said plurality of demultiplexers, and
   the signal outputs of each demultiplexer are connected to the signal inputs of the ADC units of one group of ADC units, and
   wherein said main signal input is configured to feed the analog signal to said plurality (N) of sampling units using time interleaving,
   and wherein said demultiplexers are configured to feed the sampled signal to said plurality (N) of groups of ADC units using time interleaving.

9. The multi-channel receiver of claim 8, wherein at least one demultiplexer comprises an additional signal processing circuit.

10. The multi-channel receiver of claim 9, wherein the additional signal processing circuit is selected from the group consisting of a buffer, a follower, and an amplifier.

11. The multi-channel receiver of claim 8, wherein at least one ADC unit of said plurality of ADC units is configured to resample the sampled signal output by the respective sampling unit.

12. The multi-channel receiver of claim 8, wherein the ADC comprises a clock input configured to provide a first plurality of clock signals clocking the plurality of sampling units and a second plurality of clock signals clocking the plurality of groups of ADC units.

13. The multi-channel receiver of claim 11, wherein the ADC comprises a clock input configured to provide a first plurality of clock signals clocking the plurality of sampling units and a second plurality of clock signals clocking the plurality of groups of ADC units.

14. The multi-channel receiver of claim 8, wherein at least one signal conditioning unit is arranged between the main signal input and the signal inputs of the sampling units.

15. The multi-channel receiver of claim 14, wherein the at least one signal conditioning unit comprises at least one of a copier and a buffer.

16. The multi-channel receiver of claim 8, wherein the ADC further comprises a data recombination unit configured to recombine the data being output by the data outputs of the ADC units of said plurality of groups of ADC units so as to generate a one-dimensional digital data stream.

17. The multi-channel receiver of claim 6, wherein the combiner of a first one of the at least two of the plurality of branches is configured to form complex branch signals, a real part of the complex branch signal being formed from an output signal of the first and second FIR filter of the first one of the branches alternatingly, and an imaginary part of the complex branch signal being formed from the output signal of the second and first FIR filter of the first one of the branches when the real part is formed from the output signal of the first and second FIR filter respectively, the combiner of a second one of the at least two of the plurality of branches being configured to form the real and imaginary parts of the complex branch signal by summing and subtracting the output signal of the first and second FIR filter of the second one of the branches.

18. The multi-channel receiver of claim 3, further comprising one more channel decoders, wherein a channel decoder receives a channel signal from the channel selector.

19. The multi-channel receiver of claim 18, further comprising one or more source decoders, wherein a source decoder receives an output from a channel decoder.

20. The multi-channel receiver of claim 1, further comprising a signal processing unit, wherein the signal processing unit comprises an RF pre-processing unit, wherein the RF pre-processing unit receives a source signal and provides a processed signal to the ADC.

21. The multi-channel receiver of claim 20, where the RF pre-processing unit comprises at least one of a filter, a low-noise amplifier, a variable gain amplifier and an equalizer.

22. A multi-channel receiver comprising:
   a signal processing unit, wherein the signal processing unit comprises an RF pre-processing unit, and wherein the RF pre-processing unit is configured to receive a source signal and to output a processed analog signal z which resides in a frequency band B Hz;
   an analog-to-digital converter (ADC) connected to the signal processing unit and configured to convert analog signal z using a sampling rate S to a digital signal x, wherein digital signal x is representative of analog signal z;
   a multi-band selector circuit configured to receive the digital signal x and to map the digital signal x into M time domain sub-signals $x_1 \ldots x_M$, wherein each sub-signal represents in a time domain a frequency domain content of digital signal x, wherein each sub-signal resides in a sub-range of band B, wherein each frequency component of digital signal x is represented at least in one of the sub-signals $x_1 \ldots x_M$ in its original form, and wherein each of the sub-signals $x_1 \ldots x_M$ has a sampling rate less than S;
   at least one channel selector connected to the output of the multi-band selector, and where in the at least one channel selector is configured to select at least one channel out of any sub-signals $x_1 \ldots x_M$;
   one or more channel decoders, wherein a channel decoder receives a channel signal from one of the at least one channel selectors; and
   one or more source decoders, wherein a source decoder receives an output from a channel decoder.

* * * * *